United States Patent
Miyachi

(12) 
(10) Patent No.: US 6,400,456 B1
(45) Date of Patent: Jun. 4, 2002

(54) PLANE POSITIONING APPARATUS

(75) Inventor: Takashi Miyachi, Saitama-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/697,357

(22) Filed: Oct. 27, 2000

Related U.S. Application Data

(63) Continuation of application No. 09/287,267, filed on Apr. 7, 1999, which is a continuation of application No. 08/807,647, filed on Feb. 27, 1997, now abandoned, which is a continuation of application No. 08/301,991, filed on Sep. 9, 1994, now abandoned.

(30) Foreign Application Priority Data

Sep. 14, 1993 (JP) .............................................. 5-228707
Sep. 14, 1993 (JP) .............................................. 5-228708

(51) Int. Cl.⁷ .............................................. G01N 11/00
(52) U.S. Cl. ....................................................... 356/399
(58) Field of Search ................................. 356/399, 400, 356/401, 375; 355/43, 53, 56, 55, 67, 77; 430/30; 438/16

(56) References Cited

U.S. PATENT DOCUMENTS

| | | |
|---|---|---|
| 4,698,513 A | 10/1987 | Tojo et al. |
| 4,705,940 A | 11/1987 | Kohno ........................ 250/201 |
| 4,714,331 A | 12/1987 | Oda et al. |
| 4,902,900 A | 2/1990 | Kamiya et al. |
| 5,194,893 A | 3/1993 | Nishi ........................... 355/53 |
| 5,365,051 A | 11/1994 | Suzuki et al. |
| 5,448,322 A | 9/1995 | Bacs, Jr. .................... 354/112 |
| 5,473,410 A | 12/1995 | Nishi |
| 5,502,311 A | 3/1996 | Imai et al. |
| 5,801,835 A | 9/1998 | Mizutani et al. ............ 356/375 |

FOREIGN PATENT DOCUMENTS

| | | |
|---|---|---|
| JP | 4-196513 | 7/1992 |
| JP | 5-190423 | 7/1993 |
| JP | 5-275313 | 10/1993 |

*Primary Examiner*—Frank G. Font
*Assistant Examiner*—Andrew H. Lee
(74) *Attorney, Agent, or Firm*—Oliff & Berridge PLC

(57) ABSTRACT

It is intended to perform optimum autofocusing and autoleveling control in a scanning exposure apparatus.

A focus position $\Delta Z$ (focus position of a curved surface 46 or 47) in a region 34 surrounding a slit exposure region 16A or 16 is measured on the exposure plane of a wafer. For the narrow exposure region 16A, an approximate plane of a partial curved surface 46a in the exposure region 16A is calculated by using only data on the focus position of the partial curved surface 46a. For the normal exposure region 16, an approximate plane of a partial curved surface 47a in the exposure region 16 is calculated by using only data on the focus position of the partial curved surface 47a. These approximate planes are matched with an imaging plane by an optical projection system. A curved surface 51 is obtained by filtering the curved surface 50 in the region 34 with a low-pass filter which has an amplitude transmission characteristic $|H(j\omega)|$ on a spatial frequency range. The average plane of the curved surface 51 is matched with the imaging plane of the optical projection system. Cutoff spatial frequencies $\omega_X$ and $\omega_Y$ of the low-pass filter are set to values inversely proportional to the width $W_O$ of the exposure region 16 in the scanning direction and the height $H_O$ in the nonscanning direction.

52 Claims, 7 Drawing Sheets

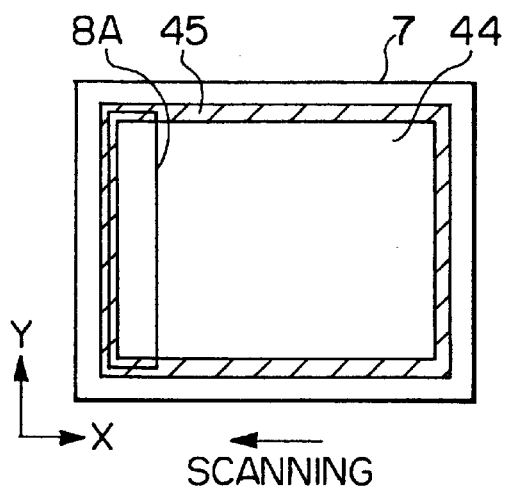
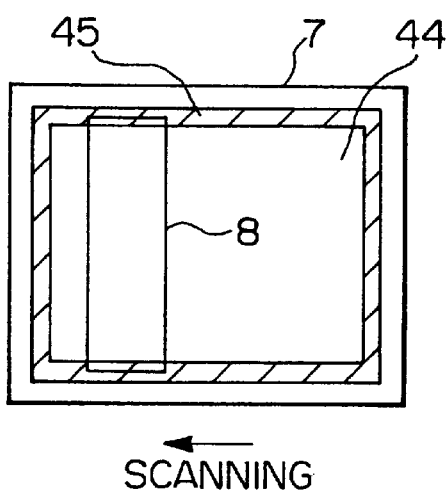
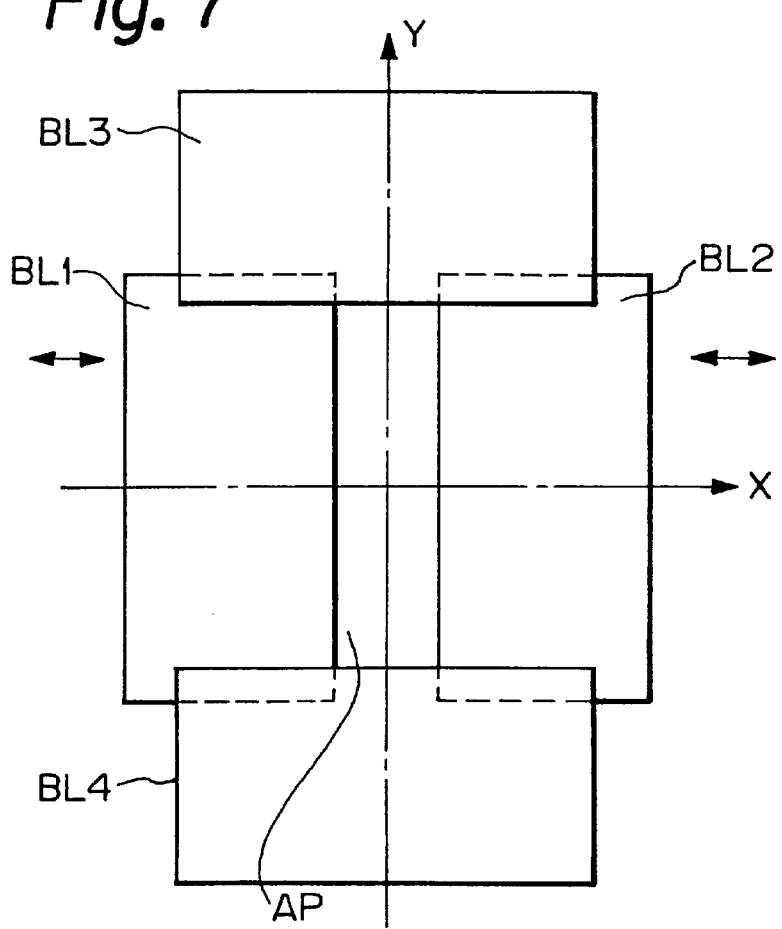

PLANE POSITIONING APPARATUS

This application is a con of Ser. No. 09/287,267, filed Apr. 7, 1999, which is a con of Ser. No. 08/807,647 filed Feb. 27, 1997, abandoned, which is a con of Ser. No. 08/301991 filed Sep, 9, 1994 abandoned.

BACKGROUND OF THE INVENTION

This invention relates to a plane positioning apparatus and, more particularly, to one suitable for application to an autofocusing mechanism or an autoleveling mechanism in a so-called step-and-scanning type exposure apparatus which sequentially exposes a pattern on a reticle onto each shot area on a photosensitive substrate by synchronously scanning the reticle and the substrate in respect to a slit radiating region that is, for example, a rectangular or an arc in shape.

Conventionally, in manufacturing a semiconductor device, a liquid crystal display element, or a thin film magnetic disk using a photolithography technique, a projection exposure apparatus has been used for exposing a pattern on a photomask or reticle (hereinafter generally called a "reticle") onto a wafer (or glass plate, etc.) on which photoresist or the like is applied, through an optical projection system. Generally, because high resolution is required for the projection exposure apparatus, and the numerical aperture of the installed optical projection system is high, the depth of focus (focus margin) of the projected image is reduced in inverse proportion to the square of the numerical aperture. Then, to align each shot region of a wafer within the range of the depth of focus in respect to the imaging plane of the optical projection system, the projection exposure apparatus has been provided with an autofocus mechanism which aligns the focus position of the wafer, at a predetermined reference point in an exposure field, with the imaging plane by the optical projection system, and an autoleveling mechanism which sets the inclination of the exposure surface of the wafer in the exposure field parallel to the imaging plane.

A conventional autofocus mechanism, on the one hand, comprises a focus position detection sensor for detecting the amount of defocus in the focus position (the position of the optical projection system in the direction of the optical axis) of a predetermined measurement point in each shot region of the wafer from the imaging plane (hereinafter called the AF sensor), and a servo system for controlling the height of the Z stage to make its amount of defocus fall within an allowable range. In the AF sensor, a grazing-incidence detector reimages the slit pattern image, which is projected on a predetermined measurement point in the exposure field at an angle, on the reception section, and detects the focus position at the measurement point by utilizing the fact that the deviation of the focus position on the wafer surface causes the position of the reimaged slit pattern image to change.

On the other hand, the autoleveling mechanism comprises a leveling sensor which detects focus positions at three or more measurement points on each shot region on the wafer, and a servo system which makes the mount of shift of the inclination of the average plane determined by the focus positions at these three or more measurement points within an allowable range.

In this regards, in a conventional batch projection exposure apparatus, such as the stepper which is generally used, because the wafer whose focus position is subject to detection is stationary during exposure, it is possible to manage the decrease in the depth of focus by improving the resolution and accuracy of the AF sensor and the leveling sensor which detect the mount of defocus, and by tuning the accuracy of the mechanism for the Z stage in the servo system, even if the numerical aperture of the optical projection system is further increased.

Recently, an one chip pattern for a semiconductor and the like has come to have a larger and larger size so that the projection exposure is required to have a larger size for projecting a pattern with a larger area on the reticle onto the wafer.

It has also become necessary to improve the resolution of the optical projection system as the pattern for a semiconductor and the like becomes finer. There is a disadvantage in that it is difficult to enlarge the exposure field of the optical projection system in its design or manufacture to improve the resolution of the optical projection system. In particular, when a catadioptric system is used as the optical projection system, an exposure field without aberration is given by a circular arc in shape.

To manage such an enlargement of the transfer pattern and the constraints of the exposure field of the optical projection system, a so-called step-and-scanning type projection exposure apparatus has been developed which synchronously scans a reticle or wafer to, for example, a rectangular, circular arc, or a hexagonal radiating region (hereinafter called a slit radiating region) to sequentially project a pattern on the reticle, which has a larger area than the slit radiating region, onto each shot region on the wafer.

Such a projection exposure apparatus also requires an autofocus mechanism and an autoleveling mechanism, both of which align the exposure surface of the wafer under exposure with the imaging plane. However, in the step-and-scanning type system, because the wafer whose focus position is to be detected moves during exposure, the output signal of the AF sensor or leveling sensor indicating the focus position of the measurement point varies as a function of the position in the scanning direction. Thus, if signal processing and control similar to that of the batch projection exposure apparatus is conducted, it results in poor follow-up capability in respect to the movement of the focus position of the wafer. Therefore, there is the disadvantage such that the exposure surface of the wafer is difficult to align with the imaging plane within the depth of focus. This disadvantage is described in detail in the following:

In the step-and-scanning type projection exposure apparatus, as described-earlier, the detection signal of a focus position is observed as a function of the position in the scanning direction in a time series. Therefore, when this signal is merely caused as a deviation signal to operate a closed-loop servo, control is performed in such a manner that the Z stage dynamically follows up the time-series signal if the system has a sufficiently fast response. If the width of the slit exposure region (exposed field) in the scanning direction is sufficiently small in respect to the scanning speed, this causes no particular disadvantage. However, the width of the slit exposure region in the scanning direction usually has a non-negligible value in respect to the scanning speed.

Therefore, even if the center of an exposure region is moved while caused to completely follow the detection signal of a focus position, the movement of the Z stage when a point on the wafer passes through the slit exposure region adversely affects the imaging characteristics at that point as vibration. Moreover, because the slit exposure region has a finite width in the scanning direction, follow-up essentially cannot be performed for unevenness finer than the limit, which is the unevenness of one cycle in the width on the wafer. The best control in this case is to perform no control. If the center of the exposure region is caused to follow the fine unevenness as in the above, any control may deteriorate an image by deterioration of the focusing accuracy.

On the one hand, the wider the width of the slit exposure region along the scanning direction, the higher the step-and-scanning type system throughput. On the other hand, if this width is large, light may leak from an area outside the blocking area at the end of the reticle to cause unnecessary exposure. Thus, as disclosed in Japanese Patent Public Disclosure No. HEI 4-196513, a method has been developed wherein the exposure region is made narrower in the scanning direction near the starting and terminating ends of the reticle, while it is made wider in the scanning direction between the starting and terminating ends of the reticle. Such a method wherein the width of the exposure region in the scanning direction is changed during exposure is not attained in a conventional stepper or the like, so a preferable control method for focusing and leveling meeting the change in the shape of the exposure region has not been devised.

SUMMARY OF THE INVENTION

In view of the above, this invention is intended to provide a plane positioning apparatus for a step-and-scanning type exposure apparatus which can hold the exposure surface of the wafer, and balance between holding of the exposure surface of the wafer within the depth of focus and the prevention of image degradation to enable optimum autofocus and autoleveling control by controlling the follow-up capability to the focus position of the exposure surface of a moving wafer in a suitable state. More particularly, it is intended to provide a plane positioning apparatus which can provide optimum autofocus and autoleveling control even when the shape of the exposure range changes during the exposure operation.

To attain the above objects, the first plane positioning apparatus according to the present invention is a plane positioning apparatus installed on a scanning exposure apparatus, which comprises a mask stage for scanning a mask formed with a transfer pattern in a predetermined direction in respect to a radiating region with a predetermined variable shape, and a substrate stage for scanning the photosensitive substrate in a predetermined direction in synchronization with the mask stage, and which sequentially exposes the pattern of the mask onto the substrate, the plane positioning apparatus being for aligning the exposure plane of the substrate with a predetermined reference plane, and comprising:

a plane positioning means installed on the substrate stage for aligning a predetermined approximate plane of the exposure plane of the substrate with the predetermined reference plane;

a height detection means for detecting the height of the exposure plane of the substrate at a plurality of measurement points in a measurement region before the exposure region of the pattern of said mask with respect to the scanning direction of the substrate; and an approximate plane calculation means for finding an approximate plane of the exposure plane of the substrate-by using a plurality of height information on the exposure plane of the substrate from the height of the plurality of measurement points detected by the height detection means, which information is measured in the variable exposure region of the pattern of the mask which varies according to the variable radiating region;

the approximate plane found by the approximate plane calculation means being aligned with the predetermined reference plane by the plane positioning means.

In addition, in the first plane positioning apparatus, the approximate plane calculation means includes a filter means which has low-pass characteristics filtering the shape of a plane, which is formed by arranging the height of the plurality of measurement points detected by the height detection means, on a spatial frequency range, an approximate plane of the exposure plane of the substrate being found from information after filtering a plurality of height information on the exposure plane of the substrate measured in the variable exposure region of the pattern of the mask with the filter means;

cutoff spatial frequencies in the amplitude transmission characteristic of the filter means in the scanning direction of the substrate and in a nonscanning direction normal to the scanning direction of the substrate being set proportional to the inverse numbers of the width of the exposure region of the pattern of the mask in the scanning direction and the width in the nonscanning direction;

the approximate plane found by the approximate plane calculation means being aligned with the predetermined reference plane by the plane positioning means.

Furthermore, in the first plane positioning apparatus, it may be possible to provide an optical projection system with a projection magnification $\beta$ between the mask and the substrate, the mask stage scanning at a speed of $V_R$ in a predetermined direction in a plane normal to the axis of the optical projection system, the substrate stage scanning at a speed of $\beta \cdot V_R$ in a direction opposite to the predetermined direction in a plane normal to the axis.

Another aspect of the first plane positioning apparatus is a plane positioning apparatus installed on a scanning exposure apparatus, which comprises a mask stage for scanning a mask formed with a transfer pattern in a predetermined direction in respect to a radiating region with a predetermined variable shape, and a substrate stage for scanning a photosensitive substrate in a predetermined direction in synchronization with the mask stage, and sequentially exposes the pattern of the mask onto the substrate, the plane positioning apparatus being for aligning the exposure plane of the substrate with a predetermined reference plane, and comprising:

a drive device for the substrate stage installed on the substrate stage and being capable of aligning a predetermined approximate plane of the exposure plane of the substrate with the predetermined reference plane at the same level and in parallel to the reference plane;

a sensor for detecting the height of the exposure plane of the substrate at a plurality of measurement points in a measurement region before the exposure region of the pattern of the mask with respect to the scanning direction of the substrate; and a computer for finding the predetermined approximate plane of the exposure plane of the substrate by using a plurality of height information on the exposure plane of the substrate from the height of the plurality of measurement points in the measurement region, which information is measured in the variable exposure region of the pattern of the mask which varies according to the variable radiating region.

In still another aspect of the first plane positioning apparatus, a scanning exposure apparatus comprises:

a illuminating system for radiating illuminating light on a mask through an opening of a variable field diaphragm positioned on a plane substantially conjugate with the pattern plane of the mask;

an optical projection system for projecting a pattern formed on the mask onto a photosensitive substrate;

a movable member for moving, during scanning exposure, the mask and the substrate in a direction substantially normal to the axis of the optical projection system;

a drive member for changing the opening width of the variable field diaphragm in interlocking with the movement of the mask;

a sensor having a plurality of measurement points in a region before the exposure region of the pattern of the mask with respect to the direction of movement of the substrate, and detecting the position of the surface of the substrate in a direction of an optical axis of the optical projection system at each of the plurality of measurement points;

a calculator for, during the scanning exposure, calculating an approximate plane of the surface of the substrate based on multiple positions in the exposure region of the pattern of the mask varying according to the opening of the variable field diaphragm of multiple positions-detected by the sensor; and a device for moving the substrate and an imaging plane of the optical projection system relative to each other so as to substantially match the approximate plane calculated with the imaging plane.

In addition, according to the first plane positioning apparatus, the calculator includes a filter member which has low-pass characteristics filtering the shape of a plane, which is formed by arranging the height of the plurality of measurement points detected by the sensor, an approximate plane of the exposure plane of the substrate being found from information on the exposure plane of the substrate measured in the variable exposure region of the pattern of the mask with the filter member.

A second plane positioning apparatus according to the present invention to attain the above objects is a plane positioning apparatus installed on a scanning exposure apparatus, which comprises a mask stage for scanning a mask formed with a transfer pattern in a predetermined direction in respect to a radiating region with a predetermined shape, and a substrate stage for scanning a photosensitive substrate in a predetermined direction in synchronization with the mask stage, and which sequentially exposes the pattern of the mask onto the substrate, the plane positioning apparatus being for aligning the exposure plane of the substrate with a predetermined reference plane, and comprising:

a plane positioning means installed on the substrate stage for aligning a predetermined approximate plane of the exposure plane of the substrate with the predetermined reference plane;

a height detection means for detecting the height of the exposure plane of the substrate at a plurality of measurement points in a measurement region near the exposure region of the pattern of said mask; and a filter means having low-pass characteristics filtering the shape of a plane, which is formed by arranging the height of the plurality of measurement points detected by the height detection means, on a spatial frequency range;

an approximate plane calculation means for finding an approximate plane of the exposure plane of the substrate in the exposure region of the pattern of said mask from the shape of the plane after filtering by the filter means;

cutoff spatial frequencies in the amplitude transmission characteristic of the filter means in the scanning direction of the substrate and in a direction normal to the scanning direction of the substrate being set proportional to the inverse numbers of the width of the exposure region the pattern of the mask in the scanning direction and the width in the nonscanning direction;

the approximate plane found by the approximate plane calculation means being aligned with the predetermined reference plane by the plane positioning means.

In addition, according to the second plane positioning apparatus, the shape of a region through which spatial frequency components in the amplitude transmission characteristic of the filter means pass can be made similar to the shape of the exposure region of the pattern of the mask.

BRIEF DESCRIPTION OF THE DRAWINGS

FIG. 6 is diagrams showing changes in the radiating region on a reticle to be exposed in the embodiment;

FIG. 7 is a plan view showing the structure of a reticle blind in the embodiment;

DETAILED DESCRIPTION OF PREFERRED EMBODIMENTS

Figure 1:
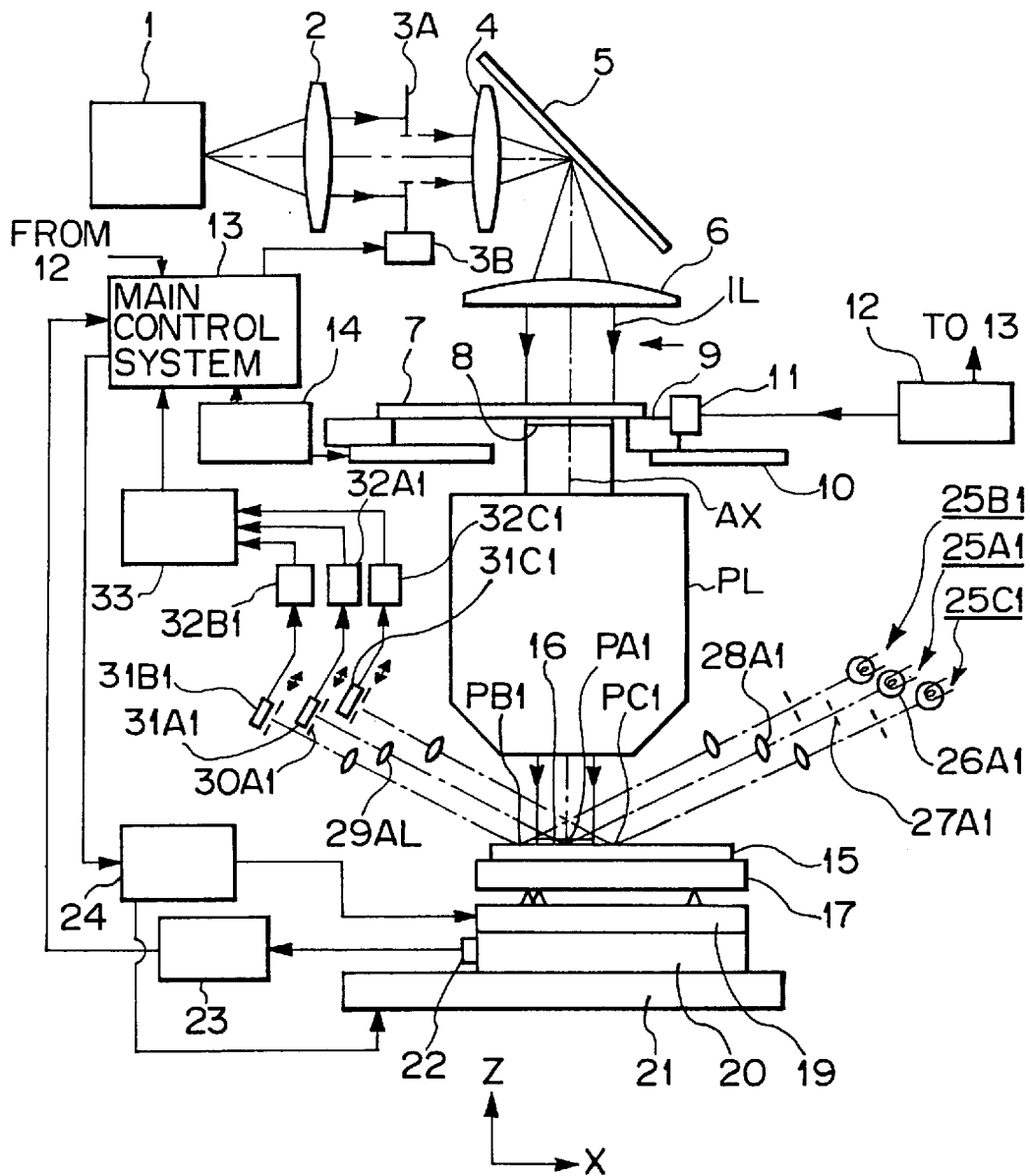
FIG. 1 is a schematic arrangement showing an entire projection exposure apparatus to which an embodiment of the plane positioning apparatus according to the present invention is applied.

An embodiment of a plane positioning apparatus according to the present invention will be described by referring to the drawings. This embodiment is an application of the present invention to an autofocus mechanism and an autoleveling mechanism of a step-and-scanning type projection exposure apparatus.

FIG. 1 shows the entire arrangement of the embodiment, wherein exposing light IL from a light source system 1, which includes a light source and an optical integrator, passes through a first relay lens 2, a reticle blind (variable field diaphragm) 3A, a second relay lens 4, a mirror 5, and a main condenser lens 6, and illuminates a rectangular radiating region 8 with uniform illuminance. The plane on which the reticle blind 3A is positioned is conjugate with the pattern-forming plane of the reticle 7. The position and shape of the radiating region 8 on the reticle 7 is determined by the position and shape of the aperture of the reticle blind 3A. A main control system 13 controlling the operation of the entire apparatus sets the position and shape of the aperture of the reticle blind 3A through a-drive section 3B.

The reticle blind 3A consists of movable blades $BL_1$, $BL_2$, $BL_3$, and $BL_4$ as shown in FIG. 7. It is arranged that the width of the radiating region 8A in the X direction (scanning exposure direction) can be changed by moving the movable blades $BL_1$ and $BL_2$ to modulate the shape and/or size of the aperture AP.

Used as the light source in the light source system 1 are an ultrahigh-pressure mercury lamp, an excimer laser, or a higher harmonic YAG laser generator.

An image of a pattern in the radiating region 8 of the reticle 7 is projected and exposed in a rectangular exposure region 16 on a wafer 15, to which photoresist has been applied, through an optical projection system PL. The Z axis is set parallel to an axis AX of the optical projection system PL, the X axis is set in a direction parallel to the surface of the paper in FIG. 1 in a two-dimensional plane normal to the axis AX, and the Y axis is set in a direction normal to the surface of the paper in FIG. 1. In the embodiment, the scanning direction of the reticle 7 and the wafer 15 when exposed by the scanning system are parallel to the X axis.

The reticle 7, on the one hand, is held on a reticle stage 9, which is in turn supported on a reticle base 10 to be driven in the X direction at a predetermined speed by, for example, a linear motor. A moving mirror 11 secured at one end of the reticle stage 9 in the X direction reflects the laser beam from a laser interferometer 12 to continuously measure the coordinate of the reticle 7 in the X direction with it. The information of the coordinate of the reticle 7 measured by the laser interferometer 12 is supplied to the main control system 13, which in turn controls the position and speed of movement of the reticle stage 9 through a reticle drive system 14.

Figure 5:
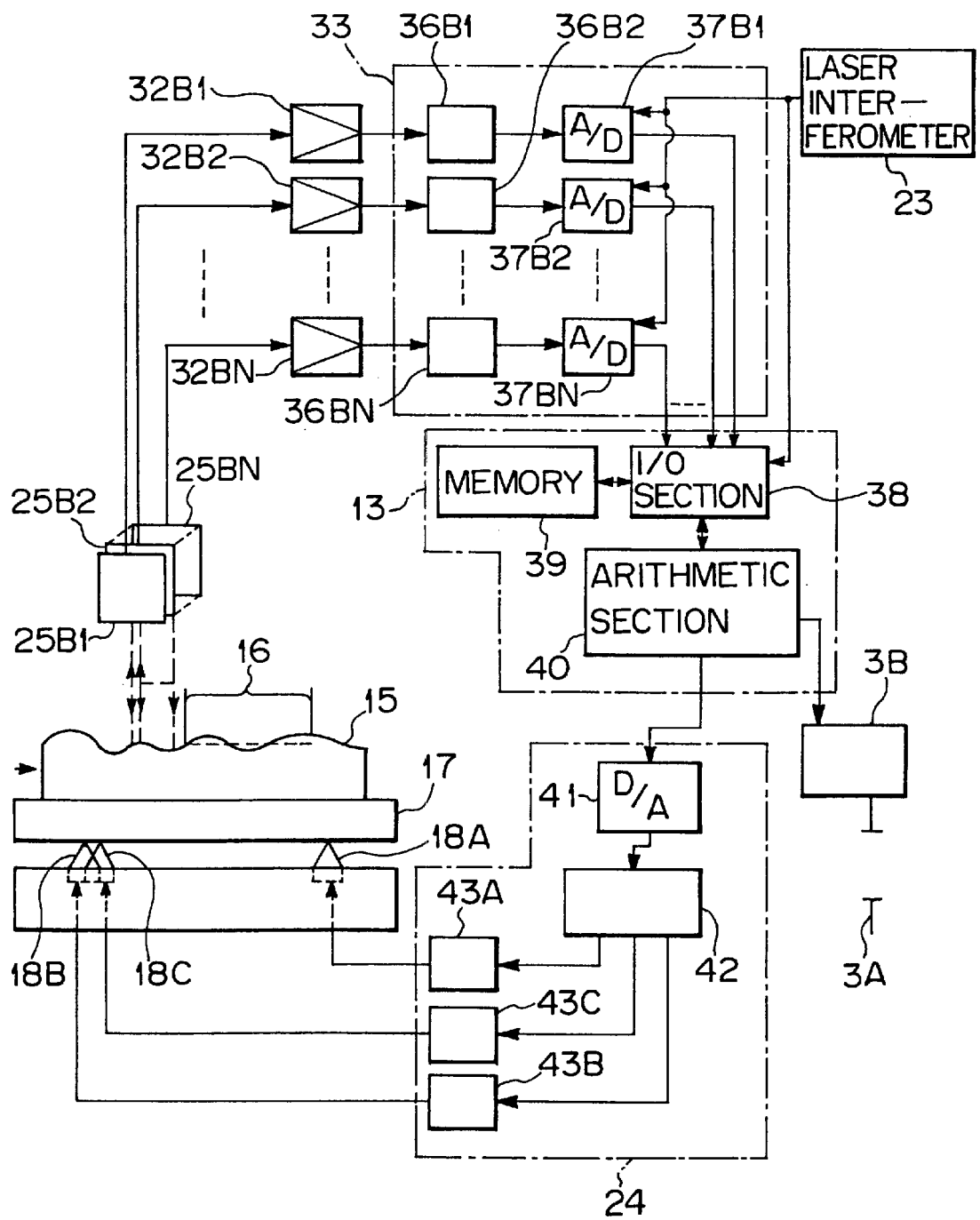
FIG. 5 is a structure of essential parts showing an example of an autofocus mechanism and an autoleveling mechanism of an embodiment.

On the other hand, the wafer 15 is held on a wafer holder 17 which constitutes a plane positioning means, and which is mounted on a Z-leveling stage 19, which also constitutes a plane positioning means, through three support points consisting of extendable piezo elements or the like (support points 18A–18C in the FIG. 5). The Z-leveling stage 19 is mounted on an X-Y stage 20, which is, in turn, supported on a wafer base 21 slidable in two dimensions. The Z-leveling stage 19 finely adjusts the position in the Z direction of the wafer 15 (focus position) on the wafer holder 17, and the inclination of the exposure surface of the wafer 15, by adjusting the level of the three supporting points. Furthermore, the Z-leveling stage 19 roughly adjusts the position of the wafer 15 in the Z direction. Moreover, the X-Y stage 20 positions the Z-leveling stage 19, the wafer holder 17, and the wafer 15 in the X and Y directions, and scans the wafer 15 parallel to the X axis at a predetermined scanning speed during scan exposure.

The X-Y coordinates of an X-Y stage 20 are continuously monitored by the laser interferometer 23 by reflecting the laser beam from the external laser interferometer 23 with the moving mirror 22 secured on the X-Y stage 20. The detected X-Y coordinates are supplied to the main control system 13. The main control system 13 controls the operation of the X-Y stage 20 and the Z-leveling stage 19 through a wafer driving system 24 which constitutes the plane positioning means. When exposure is performed in the scanning system, if the projection magnification by the optical projection system PL is assumed to be β, an image of the pattern of the reticle 7 is sequentially exposed onto the wafer 15 by scanning the wafer 15 in the X direction (or −X direction) in respect to the exposure region 16 (a region onto which the pattern is projected within a radiation region 8 on the reticle 7 by the optical projection system PL) at a speed of $V_W$ (=β·$V_R$) in synchronization with scanning of the reticle 7 through the reticle stage 9 in respect to the radiation region 8 in the −X direction (or the X direction) at a speed of $V_R$.

Figure 8A:
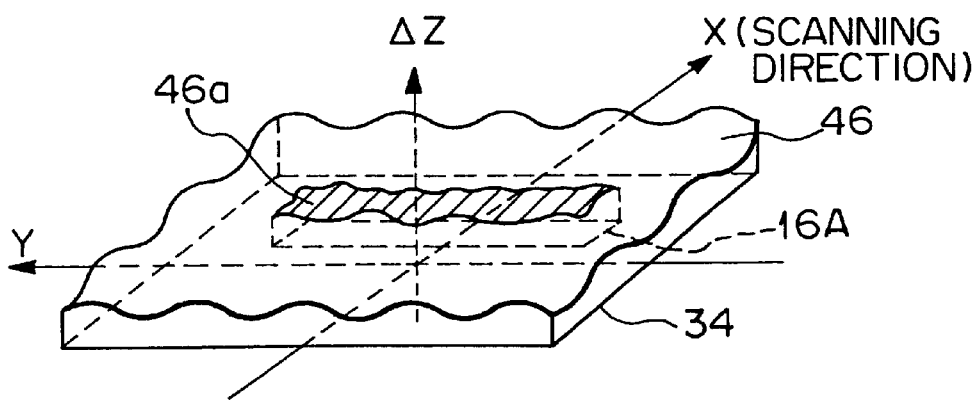
FIG. 8 is diagrams illustrating a case where the range, from which the data of a focus position are detected, is used for the calculation of an approximate plane in correspondence with the size of the exposure region on a wafer in the embodiment.
Figure 8B:
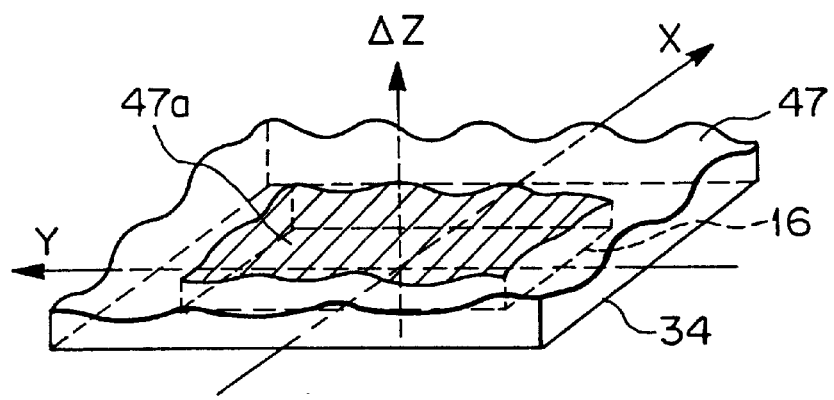

Furthermore, this apparatus can sequentially expose the pattern of the reticle 7 onto the wafer 15 while changing the shape of the radiation region. First, a pattern region 44 of the reticle 7 is surrounded by a light-blocking zone 45 with a predetermined width as shown in FIG. 6(a). When the reticle 7 is scanned in the −X direction, the radiating region 8A defined by the aperture AP has a width completely enclosed in the light-blocking zone 45 (or a width of 0) before the exposure is started. In this state, only the movable blade $BL_2$ is moved while securing the movable blade $BL_1$. This causes the width of the radiation region 8A in the scanning direction to be widened while maintaining one end of the radiating region 8A in the light-blocking zone 45 to start exposure as shown in FIG. 6(a). After the width of the radiation region 8A in the scanning direction is maximized (more precisely, reaches a value determined in accordance with the sensitivity or the like of the resist), the radiation region 8A exposes the pattern near the center of the reticle 7 while maintaining that width as shown in FIG. 6(b). In response to the states in FIGS. 6(a) and 6(b), the exposure region on the wafer 15 becomes an exposure region 16A with a narrow width in the scanning direction as shown in FIG. 8(a), and an exposure region 16 with the maximum width in the scanning direction as shown in FIG. 8(b). The drive method for the reticle blind 3A in the scanning exposure is disclosed in, for example, Japanese Patent Public Disclosure No. HEI 4-196513 in more detail.

Next, a description is made of the structure of the AF sensor (focus position detection system) in this embodiment, which constitutes a height detection means for detecting the position of the exposure surface (resist surface) of the wafer 15 (focus position) in the Z direction. In this embodiment, 3N (N is an integer of three or more) AF sensors have an identical arrangement. FIG. 1 shows the three AF sensors 25A1, 25B1, and 25C1. First, in the center AF sensor 25A1, detection light projected from a light source 26A1 and non-photosensitive to the photoresist illuminates a slit pattern in a slit plate 27A1, and the image of the slit pattern is projected onto a measurement point PA1 on the wafer 15 which is positioned at the center of the exposure region 16, at an angle to the axis AX of the optical projection system PL through an objective lens 28A1. Reflected light from the measurement point PA1 is focused on a vibrating slit plate 30A1 through a focusing lens, 29A1, and the slit pattern image projected on the measurement point PA1 is reimaged onto the vibrating slit plate 30A1.

Light passing through the slit of the vibrating slit plate 30A1 is transferred photoelectrically by a photodetector 31A1, and the photoelectrically transferred signal is supplied to an amplifier 32A1. The amplifier 32A1 synchronously detects the photoelectrically transferred signal from the photodetector 31A1 by using the drive signal of the vibrating slit plate 30A1, amplifies the obtained signal to generate a focus signal which varies substantially linearly in a predetermined range in respect to the focus position of the measurement point PA1, and supplies the focus signal to a focus signal processing system 33. Similarly, another AF sensor 25B1 projects a slit pattern image onto a measurement point PB1 in the −X direction in respect of the measurement point PA1. The light from the slit pattern image is photoelectrically transferred by a photodetector 31B1, and supplied to an amplifier 32B1. The amplifier 32B1 supplies a focus signal corresponding to the focus position of the measurement point PB1 to the focus signal processing system 33. Similarly, the AF sensor 25C1 projects a slit pattern image onto a measurement point PC1 in the X direction in respect to the measurement point PA1. Light from this slit pattern image is photoelectrically transferred by a photodetector 31C1, and supplied to an amplifier 32C1. The amplifier 32C1 supplies a focus signal corresponding to the focus position of the measurement point PC1 to the focus signal processing system 33.

In this case, the focus signals obtained by amplifying the photoelectrically transferred signals from the AF sensors 25A1–25C1 with the amplifiers 32A1–32C1 are calibrated to be zero when the measurement points PA1–PC1 match the imaging planes by the optical projection system PL, respectively. Therefore, the respective focus signals correspond to the displacement from the imaging plane of the focus positions of the measurement points PA1–PC1 (amount of defocus).

Figure 2:
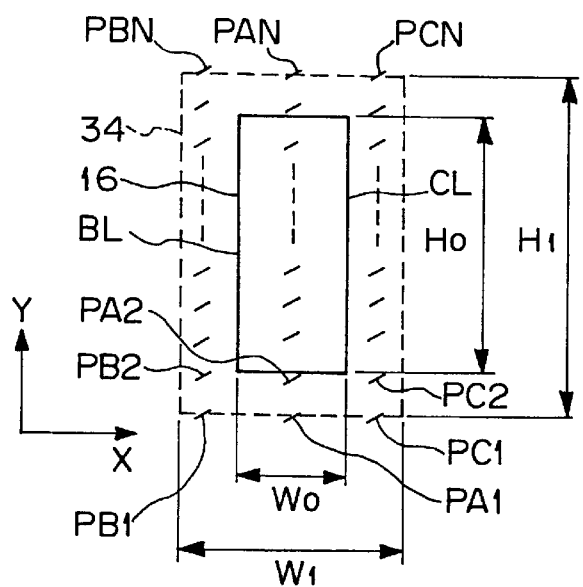
FIG. 2 is an example showing the arrangement of measurement points on the wafer 15 shown in FIG. 1.

FIG. 2 shows the distribution of the measurement points on the wafer 15 in this embodiment. In FIG. 2, N measurement points PA1–PAN are arranged at the center of the exposure region 16 along a line extending in the Y direction, when the exposure region is a rectangle with a width $W_0$ in the X direction (scanning direction) and a height $H_0$ in the Y direction. In addition, measurement points PB1–PBN are arranged at positions separated from the measurement points PA1–PAN by a predetermined distance in the −X direction, while measurement points PC1–PCN are arranged at positions separated from the measurement points PA1–PAN by a predetermined distance in the X direction. In addition, a rectangular region 34 with a width $W_1$ in the X direction and a height $H_1$ in the Y direction substantially contacting the outer measurement points PB1–PBN and PC1–PCN becomes the measurement region where the focus position is detected. It is arranged so that the focus positions of 3N measurement points in the region 34 can be independently measured by an AF sensor with the same arrangement as the AF sensor 25A1 in FIG. 1.

In this embodiment, the region 34 is set to be a region containing the exposure region 16 even if the position and shape of the exposure region 16 are maximized by changing the position and shape of the reticle blind 3A in FIG. 1.

In this embodiment, when the wafer 15 is scanned in the X direction, the measurement value of a focus signal seen ahead of the measurement points PB1–PBN in a region before the exposure region 16 with respect to the scanning direction is used. In addition, when the wafer 15 is scanned in the −X direction, the measurement value of a focus signal seen ahead of the measurement points PC1–PCN in a region before the exposure region 16 with respect to the scanning direction is used. However, in FIG. 2, although, for example, when the wafer is scanned in the X direction, the measurement value of a focus signal seen ahead of the measurement points PB1–PBN in a region before the exposure region 16 with respect to the scanning direction is used, the measurement points PB1–PBN are desired to be set on the edge BL at the left side of the exposure region 16 (−X direction), or before the edge BL with respect to the scanning direction (−X direction). Similarly, the measurement points PC1–PCN used when scanning the wafer in the −X direction are desired to be set on the edge CL at the right side of the exposure region 16 (X direction), or before the edge CL with respect to the scanning direction (X direction). Unlike this embodiment, where a method is conceived which simultaneously uses the focus signals from the 3N measurement points, but, in this case, the 3N measurement points must be placed in the region 34 in a substantially uniform density.

Figure 3:
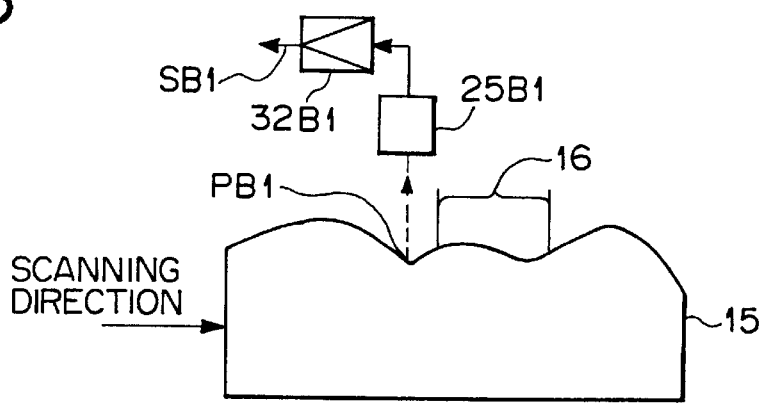
FIG. 3 is a schematic view for explaining the operation of detecting a focus position by an AF sensor when the wafer 15 is scanned in a predetermined direction.
Figure 4:
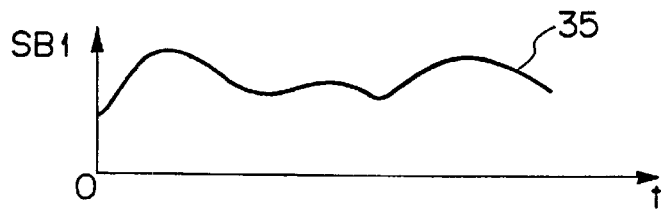
FIG. 4 is a waveform showing a focus signal by the AF sensor shown in FIG. 3.

In the following, the description assumes that the wafer 15 is scanned in the X direction as shown in FIG. 3, that is, that the reticle 7 is scanned in the −X direction. In this case, it is arranged that the focus positions of the measurement points PB1–PBN in FIG. 2 are detected by the corresponding AF sensors 25B1–25BN. FIG. 3 shows how the position is detected by the AF sensor 25B1. As shown in FIG. 3, the focus position at the measurement point PB1 in a region before the exposure region 16 with respect to the scanning direction (X direction) is measured by the AF sensor 25B1, and the photoelectric transferred signal from the AF sensor 25B1 is passed to the amplifier 32B1 to obtain the focus signal SB1. The focus signal SB1 is a signal corresponding to the deviation from the imaging plane of the focus position (position in the Z direction) of the measurement point PB1. That is, the focus signal SB1 becomes a signal corresponding to unevenness on the exposure surface of the wafer 15 as indicated by the curve 35 in FIG. 4.

FIG. 5 shows an example of the arrangement of the focus signal processing system 33, the main control system 13, and the like in this case. Used in FIG. 5 are N AF sensors 25B1–25BN for detecting the focus position of a measurement point in a region before the exposure region 16 with respect to the scanning direction. Signals photo-electrically transferred from the AF sensors 25B1–25BN are supplied as focus signals to the signal processing circuits 36B1–36BN in the focus signal processing system 33 through separate amplifiers 32B1–32BN. The signal processing circuits 36B1–36BN remove noise components caused by light disturbance or the like from the input focus signals to condition the signal components.

The focus signals from the signal processing circuits 36B1–36BN are converted to digital data by analog/digital (A/D) converters 37B1–37BN, each of which operates utilizing, as a sample clock, a synchronization signal generated for a constant position interval based on a position signal of the laser interferometer 23, which is for detecting the coordinate position of the wafer 15. Then, the digitized focus signals from the A/D converters 37B1–37BN are stored in the memory 39 in the main control system 13 through an input/output section 38 in the main control system 13. The memory 39 stores coordinates measured by the laser interferometer 23, and the focus signal at each point on the wafer 15 as a three-dimensional map in which the focus position $\Delta Z$ is assigned with respect to the two-dimensional coordinates (X, Y) based on an array of previously stored measurement points PB1–PBN. The contents of the three-dimensional map are rewritten each time data is newly sampled by the A/D converters 37B1–37BN.

Then, an arithmetic section 40 in the main control system 13 takes data out of the necessary region from the memory 39 through the input/output section 38. In this case, the arithmetic section 40 has the function of setting the position and shape of the aperture AP in the reticle blind 3A through the drive section 3B in FIG. 1 so that the position and shape of the exposure region 16 (projected region of the reticle pattern) on the wafer 15 can be accurately known from this setting information. Then, the arithmetic section 40 takes out data on the focus signal in the current exposure region 16 as described in the following, and calculates the focus position $\Delta Z_0$ of the approximate plane of the exposure surface of the wafer 15 in the current exposure region 16, as well as the inclination $\theta_Y$ and $\theta_Y$ in two directions as described later.

First, the taking out of data is described. A curved surface 46 shown in FIG. 8(a) and a curved surface 47 shown in FIG. 8(b) contact a focus plane. In the case of either FIGS. 8(a) or 8(b), the data for the focus position is detected in a region 34 surrounding the exposure region 16A or 16, and is stored in the memory 39 as a three-dimensional map, which is information about the focus position. Then, the arithmetic section 40 takes the data on the focus signal in the current exposure region 16 out of the memory 39, and calculates the approximate plane of the exposure region from the data.

That is, in the case of FIG. 8(a), on the one hand, an approximate plane for a partial curved surface 46a in a narrow exposure region 16A is calculated by using only the data represented by the partial curved surface 46a of the data on the focus position $\Delta Z$ represented by the curved surface 46 in the region 34. On the other hand, in the case of FIG. 8(b), the approximate plane of a partial plane 47a in the exposure region 16 with the maximum width is calculated by using only the data represented by the partial curved surface 47a of the data on the focus position $\Delta Z$ represented by the curved surface 47 in the region 34. That is, even if the data of focus position has been obtained over a wide extent, the approximate plane would be found using only the data in an actual slit exposure region such as 16A or 16.

It is assumed that the number of measurement points of the focus position in such an exposure region (16A or 16) is n, the two-dimensional coordinates of the i-th measurement point are $(X_i, Y_i)$ (i=1–n), and the measurement of the focus position at the i-th measurement point is $\Delta Z_i$. In this case, the inclination of the approximate plane in the X direction $\theta_X$, the inclination in the Y direction $\theta_Y$, and the focus position $\Delta Z_0$ can be calculated by the following equation:

$$\begin{pmatrix} \theta_X \\ \theta_Y \\ \Delta Z_0 \end{pmatrix} = \begin{pmatrix} \sum_{i=1}^n X_i^2 & \sum_{i=1}^n X_i \cdot Y_i & \sum_{i=1}^n X_i \\ \sum_{i=1}^n X_i \cdot Y_i & \sum_{i=1}^n Y_i^2 & \sum_{i=1}^n Y_i \\ \sum_{i=1}^n X_i & \sum_{i=1}^n Y_i & n \end{pmatrix}^{-1} \begin{pmatrix} \sum_{i=1}^n X_i \cdot \Delta Z_i \\ \sum_{i=1}^n Y_i \cdot \Delta Z_i \\ \sum_{i=1}^n \Delta Z_i \end{pmatrix} \quad \text{(Equation 1)}$$

Then, the arithmetic section 40 supplies to the wafer drive system 24 the difference of three parameters, that is, the inclination $\theta_X$, $\theta_Y$, and the focus position $\Delta Z_0$ between the imaging plane of the optical projection system which is previously determined by calibration (or test printing and the like), and its approximate plane, as the deviation. In the wafer drive system 24, the deviation data supplied by the arithmetic section 40 is supplied to a controller or demultiplexer 42 through a digital/analog converter (D/A converter) 41. The controller or demultiplexer 42 calculates the expansion or contraction of the three support points 18A–18C of the Z-leveling stage 19 for matching the exposure surface of the wafer 15 in the exposure region 16 to the imaging plane with, for example, the usual proportional and integral (PI) control, and supplies a drive signal for expanding and contracting the three support points to the support points 18A–18C of the Z-leveling stage 19 through the respective servo amplifiers 43A–43C.

Then, the expansion or contraction of the support points 18A–18C is adjusted, thereby the focus position and inclination of the exposure surface of the wafer 15 are adjusted. The focus position of the wafer 15 is detected and fed back by the AF sensors 25B1–25BN, the sum of the square error of the distance between an average plane of the exposure surface of the a wafer 15 in the exposure region 16 is set, for example, by driving the Z-levering stage 19, and the imaging plane of the optical projection system is made an evaluation function.

Convergence of the entire system is determined by whether or not the evaluation function is 0 in a predetermined allowable range. This causes the entire system shown in FIG. 5 to operate as a closed-loop servo system and, in a steady state, the system converges where the evaluation function becomes the minimum. Thus, the average plane of the exposure surface of the wafer 15 in the exposure region 16 is controlled to match the imaging plane. The evaluation function may be of an approach where the maximum defocusing in the exposure region 16 which is within a focusing range is made the minimum. In this case, the algorithm when approximating a surface to be focused with a plane is adjusted.

The servo control may be a closed-loop control as a whole by utilizing the three parameters as a speed command value to control the loop so that the command value becomes zero. Alternatively, a plane setting means may be controlled by utilizing the three parameters as a command value for the position so that the means follows the command value.

The above operation is repeatedly performed at a certain interval in synchronization with the position of the stage on which the substrate 15 is placed in the scanning direction. According to such an approach, if the exposure region 16A, 16 has a sequentially larger width in the scanning direction compared to the size of the exposure region from time to time, the approximate plane is calculated over a large area so that the entire system has a modest follow-up capability and does not follow fine unevennesses on the surface of the substrate 15, for example. In contrast, if the exposure region 16A, 16 has a smaller width in the scanning direction, the approximate plane is calculated over a narrow area so that the entire system has a fast follow-up capability and can follow even fine unevennesses on the surface of the substrate 15. Thus, even if the size of the exposure region (exposed field) dynamically changes during exposure, the autofocusing and autoleveling can be performed with the optimum follow-up accuracy in accordance with the exposure region.

In addition, controlling the follow-up capability can balance the assurance of the margin for the focus position with the prevention of deterioration of the image caused by suppressing unnecessary vibrations which are antinomic elements, and can set an optimum compromise point.

In the above embodiment, the functions of the circuit shown in FIG. 5 may be implemented by computer software. Furthermore, when the focus signal is read from memory 39 in accordance with the radiation region 8 on the reticle 7 defined by the reticle blind 3A or the width of the exposure region 16 in the wafer 15 in the scanning direction, it may be arranged to continuously read the focus signal in synchronization with the change in the size of the exposure region immediately after the starting of, or immediately before the end of, scanning exposure (other than the time when the exposure region 16 has the maximum width). Alternatively, it may be arranged to read the focus signal one step each time its size changes by a predetermined amount.

Next, the second plane positioning apparatus of the present invention is described by referring to FIG. 9. The second embodiment, when an approximate plane of the exposure plane of the substrate is found from the height data of the substrate surface measured at a plurality of the measurement points on the exposure region and in the region near it, filters high-frequency components in the spatial frequency range for the measured data. The filtering is described as follows: The entire arrangement of the projection exposure apparatus and the technique for measuring the height data of the substrate surface by the AF sensor or a height detection means, are omitted from this description because they are the same as those for the first plane positioning apparatus. However, unlike the first plane positioning apparatus, this embodiment does not necessarily limit the measurement region for the height of the substrate surface to the exposure region and the region before the exposure region 16 with respect to the scanning direction of the substrate.

Figure 9A:
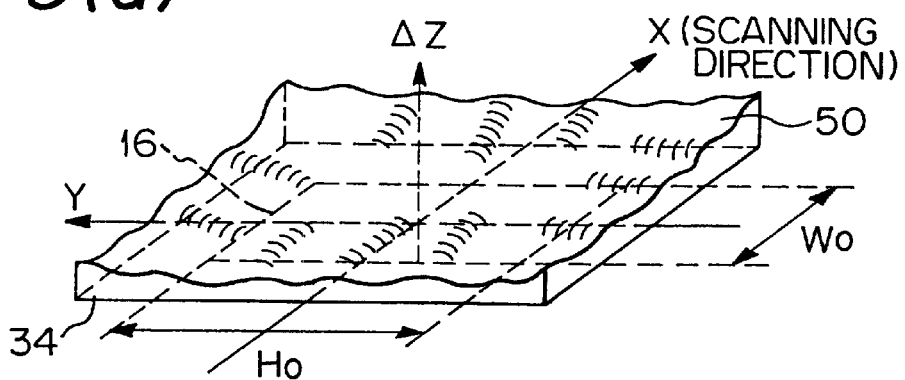
FIG. 9 is diagrams illustrating a case where filtering is performed for an aggregate of focus positions measured in the embodiment in a spatial frequency range.

First, the arithmetic section 40 determines the position and shape of the current exposure region 16 on the wafer as a focusing range, as shown in FIG. 9(a), from the information on the aperture of the reticle blind 3A in FIG. 1. For convenience of description, in FIG. 9(a), it is assumed that the center of the exposure region 16 is the origin of the coordinate system (X, Y), and the width of the exposure region 16 in the scanning direction (X direction) is $W_0$ and the height in the nonscanning direction (Y direction) is $H_0$. Although data detected by the height detection means or the AF sensor and stored in the memory 39 is a focus signal, the description is made as the focus position $\Delta Z$ is stored. The arithmetic section 40 sets a region 34 surrounding the exposure region 16 as the focusing range based on the information on the exposure region 16, and takes the data out of the focus position $\Delta Z$ for a section corresponding to the region 34 from the three-dimensional map in memory 39.

The focus position measured by the height detection means or the AF sensor may be used in real-time as it is. In this case, as shown in FIG. 2, the measurement positions for the focus position are arranged to be distributed over a detection region 34 wider than the slit exposure region 16 of the mask pattern in respect to the exposure region 16. In addition, the detection region 34 must be symmetrical in respect to the center of the exposure region 16. This is important for causing the filter means to act only on the frequency characteristics, without changing the phase characteristics when the detection signal from each measurement point is supplied to the filter means in the arithmetic section 40 and filtered.

In addition, for example, when the substrate 15 is scanned in the right direction as shown in FIG. 3, the equivalent result can be obtained by having the focus position at each measurement point on the substrate 15 read beforehand by the height detection means 25B1, 25B2, ..., 25Bn before the exposure region 16 with respect to the scanning direction, and by distributing the measurement point thus read beforehand in the detection region 34 in FIG. 2.

Figure 9B:
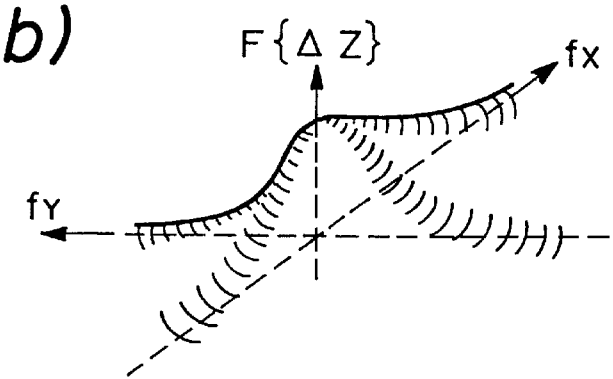

Although the curved surface 50 contacting the focus position $\Delta Z$ in the region 34 in FIG. 9(a) is represented by a continuous curved surface, the focus position $\Delta Z$ is actually discrete data sampled at a predetermined spacing in the X and Y directions, and therefore the curved surface 50 is an aggregate of discrete points. When the focus position $\Delta Z$ in FIG. 9(a) is assumed to be a function of coordinates (X, Y), and a spatial frequency corresponding to the coordinates (X, Y) is assumed to be $(f_X, f_Y)$, a Fourier variable $F(\Delta Z)$ of the focus position $\Delta Z$ has, for example, as shown in FIG. 9(b), a larger value near the origin, and becomes smaller when separating further from the origin. However, although a so-called folded distortion based on digital sampling is actually caused, it is omitted in FIG. 9(b).

Figure 9C:
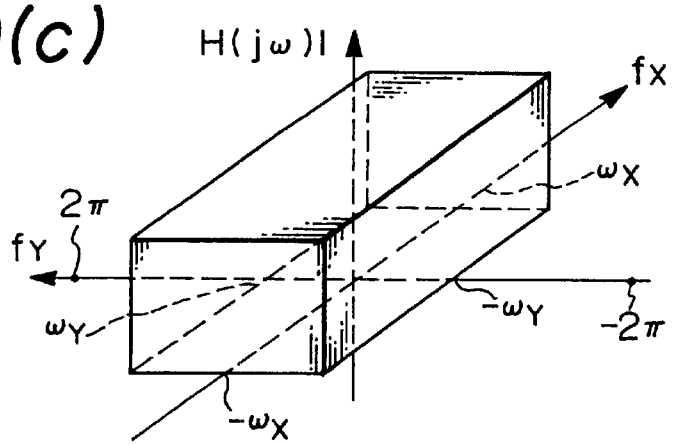

Then, this embodiment uses a filter which has an amplitude transmission characteristic $|H(j\omega)|$ in which the cut-off spatial frequency is $\pm\omega_X$ at the spatial frequency $f_X$, and the cut-off spatial frequency is $\pm\omega_Y$ at the spatial frequency $f_Y$ as shown in FIG. 9(c) as the low-pass filter in the spatial frequency region. However, the spatial frequency is normalized in FIG. 9(c).

The cut-off spatial frequencies $\omega_X$ and $\omega_Y$ are set to have the following relationships with respect to the width $W_0$ in the scanning direction of the slit exposure region 16 on the substrate 15 and the height $H_0$ in the nonscanning direction:

$$\omega_X = 2\pi/W_0$$
$$\omega_Y = 2\pi/H_0 \quad \text{(Equation 2)}$$

Causing signals to pass through such a filter means in the spatial frequency range eliminates wavelength components shorter than the wavelength which has one cycle in the exposure region 16, the focusing range, of signals indicating the focus position at each original measurement point. When such a case of focusing on an exposure region 16 with a certain area is considered, this is based on the fact that the focusing operation cannot be carried out essentially for unevenness with a wavelength shorter than the wavelength for unevenness having one cycle in such area.

At the same time, the filter means in the arithmetic means 40 generally eliminates components having a wavelength equal to or shorter than two times the interval of the arrangement of the height of the detection means (or the sampling interval in the scanning direction) which is the folded noise which is a problem in a discrete system. That is, by incorporating the filter means with such characteristics in the servo loop, it is possible to selectively apply the servo only to components which can be followed of the output signals of the height detection means. In addition, because the relationship between the exposure region 16 which is the focusing range and the transmission characteristics of the filter means 40 is clearly formulated, it may be possible to constitute a servo system which always has the optimum follow-up response at every moment when it is desired to dynamically change the focusing range so that it can be operated as an adaptive control system.

The above theoretically describes the operation of the present invention for the elimination of disturbance caused by unevenness having a shorter wavelength than the unevenness of the surface of substrate 15 which has one cycle in a focusing range with a finite area, which disturbance essentially occurs when such focusing range is controlled. However, it may be wise to intentionally set a focusing range to be followed in such a case where the configuration (spectrum) of spatial frequency for unevenness on the surface of the substrate 15 has been known beforehand. In such case, it is sufficient to generalize the cutoff spatial frequencies $\omega_X$ and $\omega_Y$ by adding coefficients $\alpha_X$ and $\alpha_Y$ to the above equation (2) as follows. However, an example of the value of coefficients $\alpha_X$ and $\alpha_Y$ is a real number between 0 and 1.

$$\omega_X = 2\pi \cdot \alpha_X / W_0$$
$$\omega_Y = 2\pi \cdot \alpha_Y / H_0 \quad \text{(Equation 3)}$$

In other words, the filter on the spatial frequency range in this embodiment shown in FIG. 9(c) is a rectangle similar to the exposure region 16 shown in FIG. 9(a). However, because the cutoff spatial frequencies $\omega_X$ and $\omega_Y$ are inversely proportional to the width $W_0$ and the height $H_0$, strictly speaking, the filters on the spatial frequency range are similar to graphics rotating the exposure region 16 by 90°. The values of the coefficients $\alpha_X$ and $\alpha_Y$ are set according to the upper limits of the spatial frequencies to be eliminated.

Figure 9D:
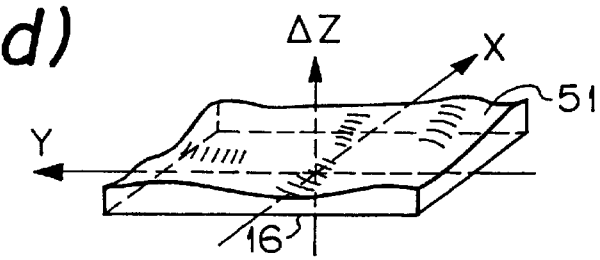

A function multiplying the Fourier transform F(ΔZ) shown in FIG. 9(b) with the low-pass filter in FIG. 9(c) is the Fourier transform function for a surface after filtering the curved surface 50 of the region 34 of FIG. 9(a). A curved surface 51 contacting the focus position ΔZ of the exposure region 16 after filtering is found as shown in FIG. 9(d) by an inverse Fourier transform of the Fourier transform function. The arithmetic section 40 determines an average plane from the curved surface 51 by the least squares method.

Actually, the arithmetic section 40 performs a convolution operation instead of the operation performing an inverse Fourier transform on the result of the multiplication of the Fourier transform of the focus position ΔZ with the low-pass filter. That is, the focus signal corresponding to the curved surface 51 of FIG. 9(d) is calculated by convoluting data of focus signals in the region 34 in FIG. 9(a) with the Fourier transform function for the low-pass filter in FIG. 9(c). Specifically, in FIG. 9(a), it is assumed that the exposure region 16, the focusing range, has the width $W_0$ of 8 mm and the height $H_0$ of 18 mm, that there are provided measurement points of 9 in the Y direction and 7 in the X direction, 63 in total (=9×7) in it, and that the region 34 to be calculated surrounding the exposure region 16 has a width of 16 mm in the X direction and a height of 24 mm in the Y direction.

Then, convolution is performed by Fourier transform of the low-pass filter having the characteristics in FIG. 9(c) using a convolution window with a size of 9×3. The subsequent process is as described above.

Figure 10:
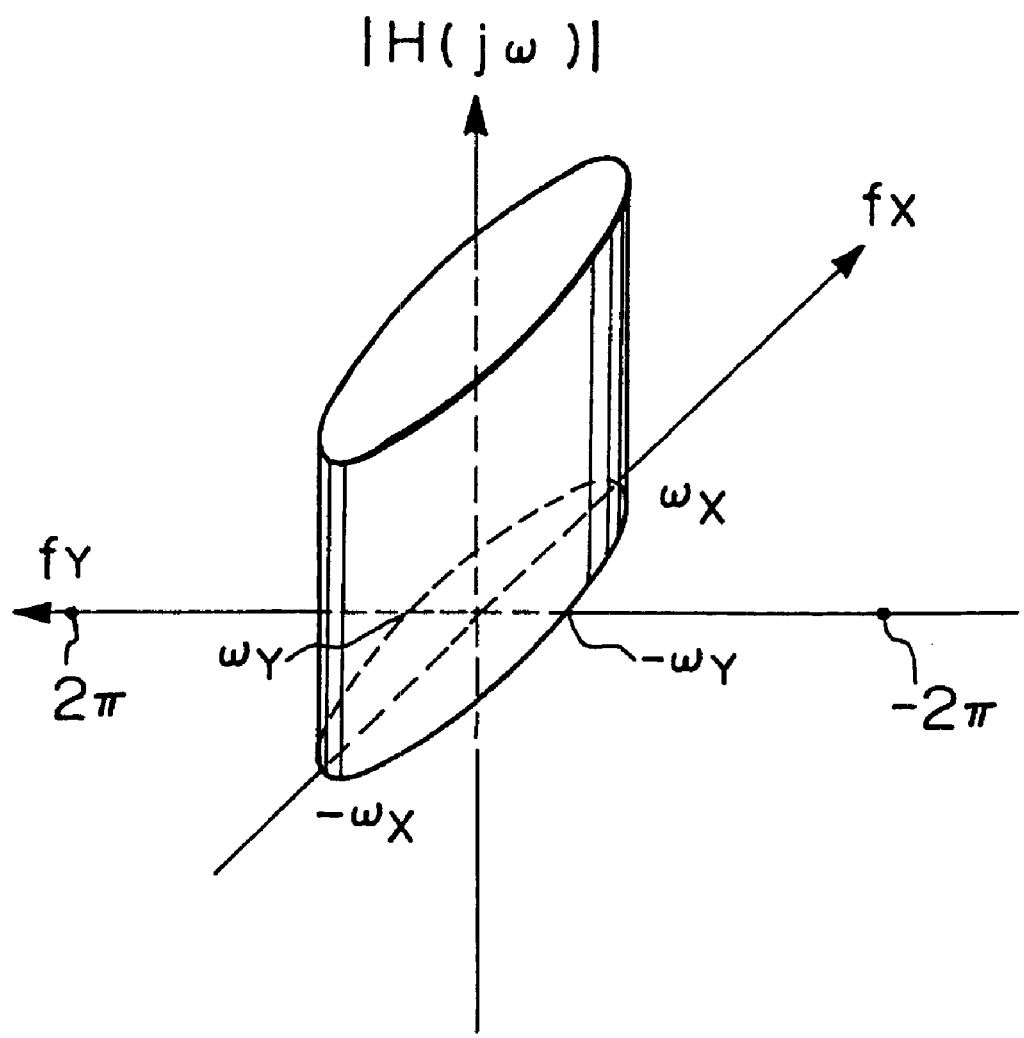
FIG. 10 is another example of characteristics of a low-pass filter in a spatial frequency range.

It may be possible to employ as the characteristics of the low-pass filter on the spatial frequency not only the characteristics similar to the exposure region 16 as in FIG. 9(c), but also the characteristics whose value is a predetermined value in a substantially oval region on the coordinates ($f_X$, $f_Y$) of the spatial frequency as shown in FIG. 10. Even in the case of FIG. 10, the cutoff spatial frequency at the spatial frequency $f_X$ is $\pm\omega_X$, and that at the spatial frequency $f_Y$ is $\pm\omega_Y$.

As described, once an average plane of the exposure region is determined by the data after filtering, the arithmetic section 40 supplies to the wafer drive system 24 the difference of three parameters, that is, the inclination $\theta_X$, $\theta_Y$, and the focus position $\Delta Z_0$ between the imaging plane of the optical projection system which is previously determined by calibration, and its approximate plane, as the deviation. Then, as in the first plane positioning apparatus, the expansion or contraction of the three support points 18A–18C of the Z-leveling stage 19 is calculated, and the drive signals for the expansion or contraction of these three are supplied to the support points 18A–18C through respective servo amplifiers 43A–43C. Thus, the focus position and the inclination of the exposure plane of the wafer 15 are properly adjusted.

The filtering described above may be applied to the first plane positioning apparatus. That is, when the exposure region changes its shape, an approximate plane of the exposure plane of the substrate may be found by extracting data of an actual exposure region from a plurality of focus positions in the region 34 which has been read beforehand, and performing a filtering similar to the above on that data.

Although the above-described first and second plane positioning apparatuses are applied to a projection exposure apparatus installed with an optical projection system, the present invention can be applied to other projection exposure apparatuses such as a reflecting projection exposure apparatus, a proximity exposure apparatus, or a contact exposure apparatus. Furthermore, as for the filtering, a similar effect can be obtained by applying the present invention to devices other than the exposure apparatus such as an inspection device or a processing device as long as they position the position of the plane to that of a moving object. Thus, the present invention is not limited to the above embodiments, but may have various arrangements without departing from the scope and spirit of the present invention.

The present invention particularly exhibits a significant effect in a step-and-scanning projection exposure apparatus installed with a high resolution optical projection system when it has less margin for both the depth of focus and the critical resolution performance.

What is claimed is:

1. In a plane positioning apparatus installed on a scanning exposure apparatus, which comprises a mask stage for scanning a mask formed with a transfer pattern in a predetermined direction in respect to a radiating region with a predetermined variable shape, and a substrate stage for scanning a photosensitive substrate in a predetermined direction in synchronization with said mask stage, and which sequentially exposes the pattern of said mask onto said substrate, said plane positioning apparatus being for aligning the exposure plane of said substrate with a predetermined reference plane, and comprising:

a plane positioning means installed on said substrate stage for aligning a predetermined approximate plane of the exposure plane of said substrate with said predetermined reference plane;

a height detection means for detecting height information of the exposure plane of said substrate at a plurality of measurement points in a measurement region before an exposure region of the pattern of said mask with respect to the scanning direction of said substrate; and an approximate plane calculation means for calculating said approximate plane of the exposure plane of said substrate by using a plurality of the height information on the exposure plane of said substrate from said height detection means;

wherein said plurality of the height information is selected in accordance with a variation in shape of said exposure region, and the shape of the exposure region varies according to said variable radiating region during the scanning exposure; and wherein the calculated approximate plane being aligned with said predetermined reference plane by said plane positioning means.

2. A plane positioning apparatus according to claim 1, wherein said approximate plane calculation means includes a filter means which has low-pass characteristics filtering the height information of said plurality of measurement points detected by said height detection means, an approximate plane of the exposure plane of said substrate being calculated from information after filtering the plurality of the height information on the exposure plane of said substrate measured in the variable exposure region of the pattern of said mask with said filter means;

cutoff spatial frequencies in an amplitude transmission characteristic of said filter means in the scanning direction of said substrate and in a nonscanning direction normal to the scanning direction of said substrate being set in proportion to inverse numbers of a width of the exposure region of the pattern of said mask in the scanning direction of said substrate and the width in the nonscanning direction of said substrate;

the calculated approximate plane being aligned with said predetermined reference plane by said plane positioning means.

3. A plane positioning apparatus according to claim 1, wherein an optical projection system with a projection magnification β is provided between said mask and said substrate, said mask stage scanning at a speed of $V_R$ in a predetermined direction in a plane normal to the axis of said optical projection system, said substrate stage scanning at a speed of $\beta \cdot V_R$ in a direction opposite to said predetermined direction in a plane normal to said axis.

4. In a plane positioning apparatus installed on a scanning exposure apparatus, which comprises a mask stage for scanning a mask formed with a transfer pattern in a predetermined direction in respect to a radiating region with a predetermined variable shape, and a substrate stage for scanning a photosensitive substrate in a predetermined direction in synchronization with said mask stage, and which sequentially exposes the pattern of said mask onto said substrate, said plane positioning apparatus being for aligning the exposure plane of said substrate with a predetermined reference plane, and comprising:

a drive device installed on said substrate stage for aligning a predetermined approximate plane of the exposure plane of said substrate with said predetermined reference plane at a same level and in parallel to said reference plane;

a sensor for detecting height information of the exposure plane of said substrate at a plurality of measurement points in a measurement region before an exposure region of the pattern of said mask with respect to the scanning direction of said substrate; and a computer for calculating said predetermined approximate plane of the exposure plane of said substrate by using a plurality of the height information on the exposure plane of said substrate from said sensor, wherein said plurality of the height information is selected in accordance with a variation in a shape of said exposure region, and the shape of the exposure region varies according to said variable radiating region during the scanning exposure.

5. A scanning exposure apparatus comprising:

an illumination system for radiating illumination light on a mask through an opening of a variable field diaphragm positioned on a plane substantially conjugate with a pattern plane of the mask;

an optical projection system for projecting a pattern formed on said mask onto a photosensitive substrate;

a movable member for moving, during scanning exposure, said mask and said substrate in a direction substantially normal to an axis of said optical projection system;

a drive member for changing a width of the opening of said variable field diaphragm in accordance with the movement of said mask;

a sensor system having a plurality of measurement points in a region before an exposure region of the pattern of said mask with respect to the direction of movement of said substrate, and detecting position information of a surface of said substrate in a direction of the optical axis of said optical projection system at each of said plurality of measurement points;

a calculator for, during said scanning exposure, calculating an approximate plane of the surface of said substrate based on the position information in the exposure region detected by the sensor system, the shape of the exposure region varying according to a change in a width of the opening of said variable field diaphragm and the approximate plane being calculated in accordance with the change in the shape of the exposure region; and a device for moving said substrate and an imaging plane of said optical projection system relative to each other so as to substantially match said approximate plane calculated with said imaging plane.

6. A plane positioning apparatus according to claim 5, wherein said calculator includes a filter member which has low-pass characteristics filtering the height information of said plurality of measurement points detected by said sensor system, an approximate plane of the exposure plane of said substrate being calculated from information on the exposure plane of said substrate measured in the variable exposure region of the pattern of said mask with said filter member.

7. A scanning projection exposure method wherein an image of a pattern on a mask is transferred onto a substrate through an optical projection system while said mask and said substrate move in synchronization with one another, said scanning exposure method comprising:

changing, during scanning exposure, a shape of an exposure region on said substrate;

selecting a part of position data, in a direction perpendicular to an image of said optical projection system, of a plurality of positions on a surface of said substrate during scanning exposure in accordance with the change in shape of said exposure region;

calculating an approximate plane of said surface of the substrate based on said selected position data; and moving said substrate and said image plane relatively with respect to one another to adjust a positional relationship between said calculated approximate plane and said image plane of the optical projection system.

8. A scanning projection exposure method according to claim 7, wherein said shape of the exposure region is defined in a rectangle having a long side in a direction substantially perpendicular to a moving direction of said substrate, and the change of said shape of the exposure region includes a change of a width of said rectangle in said direction of movement of said substrate.

9. A scanning projection exposure method according to claim 7, further comprising:

measuring said position data of the plurality of positions on said surface of the substrate.

10. A scanning projection exposure method wherein an image of a pattern on a mask is transferred onto a substrate through an optical projection system while said mask and said substrate move in synchronization with one another, said scanning exposure method comprising:

altering a condition for selecting a part of position data, in a direction perpendicular to an image plane of said optical projection system, of a plurality of positions on a surface of said substrate during scanning exposure in accordance with change in a shape of an exposure region on said substrate, wherein the shape of said exposure region changes during the scanning exposure; and adjusting a positional relationship between said substrate and said image plane based on said selected position data.

11. A scanning projection exposure apparatus wherein a mask and a substrate are moved synchronously, said apparatus comprising:

a variable field diaphragm arranged on a plane substantially conjugate with a pattern plane of the mask;

an optical projection system disposed between said mask and the substrate, which projects an image of a pattern formed on said mask onto the substrate;

a driving system, functionally connected with said variable field diaphragm, which changes a shape of an opening of said variable field diaphragm during scanning exposure;

a calculator, functionally connected with said driving system, which calculates an approximate plane of a surface of said substrate based on a part of position data at a plurality of positions on said surface of the substrate in a direction perpendicular to an image plane of said optical projection system, the part of position data being selected in accordance with said change in the opening shape of said variable field diaphragm during scanning exposure; and an adjusting system, functionally connected with the calculator, which adjusts a positional relationship between said substrate and said image plane based on said calculated approximate plane.

12. A scanning projection exposure apparatus according to claim 11, further comprising:

a sensor, functionally connected with said calculator, which has a plurality of measurement points in a region apart from an exposure region on the substrate with respect to a direction of movement of said substrate and which is used for obtaining said position data.

13. A scanning projection exposure apparatus according to claim 11, further comprising:

a memory, functionally connected with said calculator, which memorizes said position data perpendicular to said image plane of said projection system.

14. A scanning projection exposure apparatus according to claim 11, wherein said calculator calculates an inclination of said approximate plane and a distance along an optical axis of said optical projection system between said approximate plane and said image plane of said optical projection system.

15. A scanning projection exposure apparatus in which a mask and a substrate are moved synchronously, the apparatus comprising:

an optical projection system disposed between said mask and said substrate, which projects an image of a pattern formed on said mask onto said substrate;

a sensor system which has measurement points in a region before an exposure region on the substrate with respect to a direction of movement of said substrate, wherein said sensor system measures position data, in a direction perpendicular to an image plane of said optical projection system, of a surface of said substrate at each point of said measurement points; and an adjustment system, functionally connected with said sensor system, which adjusts a positional relationship between said substrate and said image plane of said optical projection system based on a part of position data measured by said sensor system during scanning exposure, wherein the part of position data are selected in accordance with change in a shape of said exposure region.

16. A scanning projection exposure apparatus wherein a mask and a substrate are moved synchronously, the apparatus comprising:

an optical projection system disposed between said mask and said substrate, which projects an image of a pattern formed on said mask onto said substrate;

a sensor system which has measurement points to measure position data, in a direction perpendicular to an image plane of said optical projection system, of a surface of said substrate during scanning exposure; and a filtering system, functionally connected with said sensor, which has a filtering characteristic based on a shape of an exposure region and which filters the position data measured by said sensor system, said exposure region on said substrate corresponding to a radiation region of an exposure beam on said mask; and an adjustment system, functionally connected with said filtering system, which adjusts a positional relationship between said substrate and said image plane of said optical projection system based on the filtered position data during scanning exposure.

17. A scanning projection exposure apparatus according to claim 16, wherein said shape of said exposure region changes during scanning exposure.

18. A scanning projection exposure apparatus according to claim 16, wherein said exposure region is defined in a rectangle having a long side in a direction substantially perpendicular to a moving direction of said substrate and a short side in the moving direction of said substrate, and said filtering characteristic of said filtering system is based on a length of the long side and a length of the short side of said rectangle.

19. A scanning exposure method wherein an image of a pattern on a mask is projected onto a substrate through an optical projection system while said mask and said substrate move in synchronization with one another, said scanning exposure method comprising:

obtaining position data, in a direction perpendicular to an image plane formed by said optical projection system, of a surface of said substrate at each of a plurality of measurement points;

filtering said obtained position data by using a filter system having a filtering characteristic defined based on a shape of an exposure region, wherein said exposure region on said substrate corresponds to a radiation region of an exposure beam on said mask; and adjusting a positional relationship between the substrate and said image plane of said optical projection system based on the filtered position data.

20. A scanning exposure method wherein an image of a pattern formed on a mask is projected onto a substrate through an optical projection system, said method comprising:

detecting, during scanning exposure, position data in an optically axial direction of said optical projection system at a plurality of positions on a surface of said substrate;

selecting, during the scanning exposure, position data in accordance with a change in shape of an exposure region out of said detected position data; and moving, during the scanning exposure, said substrate and an imaging plane of said optical projection system with respect to one another based on the selected position data.

21. A scanning method according to claim 20 wherein said substrate is moved relative to the exposure region during the scanning exposure and wherein the position data in the exposure region are selected sequentially during the scanning exposure.

22. A scanning exposure method according to claim 21, wherein an approximate plane in the exposure region is calculated based on the selected position data.

23. A scanning exposure apparatus comprising:
a beam source which emits an exposure beam;
an optical projection system which projects an image of a pattern of a mask onto a substrate, said optical projection system being disposed between said mask and said substrate;
a variable field diaphragm arranged between said beam source and said substrate, wherein a shape of an exposure region on said substrate changes in accordance with changes in a shape of an opening of said variable field diaphragm during scanning exposure;
a sensor system which obtains position data in an optically axial direction of said optical projection system of a surface of said substrate at a plurality of measurement points; and
an adjustment system which selects, during the scanning exposure, position data in accordance with the change in the shape of said exposure region out of the position data obtained by said sensor system and which moves said substrate and an imaging plane of said optical projection system relatively with respect to one another based on the selected position data, said adjustment system being associated with said variable field diaphragm and said sensor system.

24. A scanning exposure method for exposing a substrate with an image of a pattern of a mask through an optical projection system, the method comprising:
measuring, during scanning exposure, a position on a surface of said substrate in an optically axial direction of said optical projection system at a plurality of measurement points related to an exposure region on said substrate, the exposure region on said substrate corresponding to an illumination region of an exposure beam on said mask; and
filtering a signal obtained by measuring the position by using a filter having a transmission characteristic which has a predetermined relationship with the shape of said exposure region; and
adjusting a positional relationship between said substrate and an imaging plane of said optical projection system based on the signal obtained after said filtering.

25. A scanning exposure apparatus comprising:
an optical projection system which projects an image of a pattern of a mask onto a substrate, said optical projection system disposed between said mask and said substrate;
a sensor system which measures a position in an optically axial direction of said optical projection system on an exposure plane of said substrate at a plurality of measurement points related to an exposure region on said substrate, the exposure region on said substrate corresponding to an illumination region of an exposure beam on said mask; and
a filtering system which filters a signal from said sensor system, said filtering system having a transmission characteristic which has a predetermined relationship with the shape of said exposure region.

26. An exposure method in which a substrate is exposed, the method comprising:
providing said substrate;
exposing said substrate by moving a mask and said substrate synchronously, wherein a shape of an exposure region on said substrate changes during the exposure;
obtaining, in accordance with the change in shape of the exposure region on said substrate, positional information on a surface of said substrate placed in said exposure region during the exposure; and
adjusting a positional relationship between an image plane and an exposure surface of said substrate on the basis of the obtained information.

27. An exposure method according to claim 26, further comprising:
measuring positions of the surface of said substrate in a direction substantially perpendicular to the surface at each of a plurality of measurement points to obtain said information on the surface.

28. An exposure method according to claim 26, further comprising:
providing a mask on which a pattern to be transferred to said substrate is formed;
changing a shape of an illuminating region on said mask during the exposure, wherein said shape of the exposure region changes according to said shape of the illuminating region.

29. An exposure method according to claim 27, further comprising:
selecting, in accordance with the change of the shape of the exposure region, a part of position data obtained by the measurement at the measurement points.

30. An exposure method according to claim 26, further comprising:
moving said substrate, during the exposure, relative to the exposure region.

31. An exposure method according to claim 27, wherein said measurement points are arranged outside the exposure region on said substrate.

32. An exposure method according to claim 27, wherein said measurement points are disposed before said exposure region in a moving direction of said substrate.

33. An exposure method according to claim 26, wherein said obtained information on the surface includes information about an inclination of the surface of the substrate.

34. An exposure method according to claim 27, wherein said plurality of measurement points are included in one of two groups of measurement points respectively arranged in the opposite sides of said exposure region with respect to the direction parallel to the movement direction of the substrate.

35. An exposure method according to claim 34, wherein said one group of measurement points is chosen according to the movement direction of the substrate.

36. A scanning exposure apparatus in which a mask and a substrate are moved synchronously to expose the substrate with a pattern formed on the mask, the apparatus comprising:
an irradiation system, disposed along a path of an exposure beam which directs the exposure beam to an exposure region, wherein the substrate is moved relative to the exposure region during exposure;
a variable field diaphragm, disposed in the irradiation system, which defines the exposure region, wherein a shape of the exposure region changes during the exposure;
a sensor which detects focussing information of the substrate at measurement points during the exposure; and
an adjustment system, functionally connected to the variable field diaphragm and the sensor, which adjusts a positional relationship between an image surface and the substrate during the exposure, based on the shape of the exposure region and the detected focussing information.

37. A scanning exposure apparatus according to claim 36, further comprising an interferometer system which measures positional information of the substrate in a scanning direction during the exposure, and wherein a signal from the sensor is sampled on the basis of a signal from the interferometer system during the exposure.

38. A scanning exposure apparatus according to claim 36, wherein the exposure region is defined in a rectangle and the measurement points of the sensor are arranged along a long side of the rectangle exposure region.

39. A scanning exposure apparatus according to claim 38, wherein the sensor has measurement points outside of the exposure region.

40. A scanning exposure apparatus according to claim 39, wherein the sensor has measurement points inside of the exposure region.

41. A scanning exposure apparatus according to claim 38, wherein the adjustment system adjusts the positional relationship based on the focussing information corresponding to a surface of the substrate within the exposure region during the exposure.

42. A scanning exposure apparatus according to claim 41, wherein the adjustment system sequentially calculates, during the exposure, an approximate plane of the surface of the substrate within the exposure region to adjust the positional relationship.

43. An exposure method according to claim 28, wherein the shape of the illuminating region on said mask is defined by using a variable field diaphragm, the variable field diaphragm having four blades to define a width of the illuminating region in a scanning direction of the mask and in a direction perpendicular to the scanning direction.

44. An exposure method according to claim 43, further comprising:

measuring positions of the surface of said substrate in a direction substantially perpendicular to the surface at each of a plurality of measurement points to obtain said positional information on the surface.

45. An exposure method according to claim 44, further comprising:

selecting, in accordance with the change of the shape of the exposure region, a part of position data obtained by the measurement at the measurement points.

46. An exposure method according to claim 44, wherein the plurality of measurement points are arranged outside the exposure region.

47. A scanning exposure apparatus according to claim 36, wherein said variable field diaphragm has four blades to define a width of an illumination region in a scanning direction of the mask and in a direction perpendicular to the scanning direction.

48. A scanning exposure apparatus according to claim 47, wherein said sensor has measurement points outside of the exposure region.

49. A scanning exposure apparatus according to claim 47, wherein said sensor had measurement points inside of the exposure region.

50. An scanning exposure apparatus according to claim 47, wherein said sensor has measurement points inside and outside of the exposure region.

51. A scanning exposure apparatus according to claim 47, wherein said measurement points are included in one of two groups of measurement points respectively arranged in opposite sides of said exposure region with respect to a direction parallel to the movement direction of the substrate.

52. A scanning exposure apparatus according to claim 51, wherein said one group of measurement points is chosen according to the scanning direction of the substrate.

* * * * *